United States Patent [19]

Miyake et al.

[11] Patent Number: 5,117,427
[45] Date of Patent: May 26, 1992

[54] COMMUNICATION SYSTEM WITH CONCATENATED CODING ERROR CORRECTION

[75] Inventors: Makoto Miyake; Toshiharu Kojima, both of Kamakura, Japan

[73] Assignee: Mitsubishi Denki Kabushiki Kaisha, Tokyo, Japan

[21] Appl. No.: 318,152

[22] Filed: Mar. 2, 1989

[30] Foreign Application Priority Data

Mar. 3, 1988 [JP] Japan .................................. 63-51167
Aug. 18, 1988 [JP] Japan ................................ 63-205551

[51] Int. Cl.$^5$ ..................... G06F 11/10; H03M 13/12
[52] U.S. Cl. ..................................... 371/37.4; 371/42; 371/43; 371/46
[58] Field of Search ........................ 371/37.1, 37.4, 42, 371/43, 46

[56] References Cited

U.S. PATENT DOCUMENTS

| | | | |
|---|---|---|---|
| 3,988,677 | 10/1976 | Fletcher et al. | 371/37.5 |
| 4,035,767 | 7/1977 | Chen et al. | 371/43 |
| 4,211,996 | 7/1980 | Nakamura | 371/43 |
| 4,240,156 | 12/1980 | Doland | 371/43 |
| 4,312,070 | 1/1982 | Coombes et al. | 371/42 |
| 4,567,591 | 1/1986 | Gray et al. | 371/43 |
| 4,713,817 | 12/1987 | Wei | 371/43 |
| 4,907,233 | 3/1990 | Deutsch et al. | 371/43 |
| 4,918,446 | 4/1990 | Yagi | 371/46 |

FOREIGN PATENT DOCUMENTS 2095517 9/1982 United Kingdom .................. 371/43

OTHER PUBLICATIONS

Sandrin et al., Aeronautical Satellite Data Link Study, COMSAT Technical Review 15, No. 1, 1985, pp. 1-38.
Liu et al., Recent Results on the Use of Concatenated Reed-Solomon/Viterbi Channel Coding and Data Compression for Space Communications, IEEE Trans. on Comm. vol. COM-32; No. 5, May 1984, pp. 518-523.
Bartee, Thomas C., "Data Communications, Networks, and Systems", Howard W. Sams & Co., Inc., 1985, pp. 318-325.

Primary Examiner—Charles E. Atkinson
Attorney, Agent, or Firm—Wolf, Greenfield & Sacks

[57] ABSTRACT

In the concatenated coding data compensation communication system, the coding and decoding are performed in a differential coder and a differential decoder. 2-channel output obtained after coding is parallel-to-serial converted and then subjected to synonym insertion before being transmitted. On the receiving side, the received data is supplied after detection and removal of sync-words in a Viterbi decoder, and the decoder is operated on the basis of the timing of detection of the detected sync-words.

22 Claims, 13 Drawing Sheets

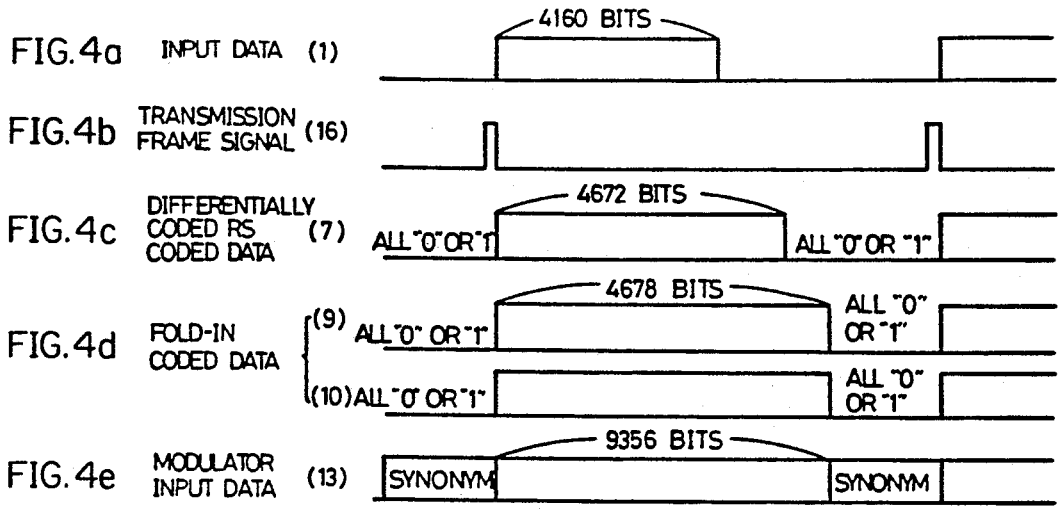
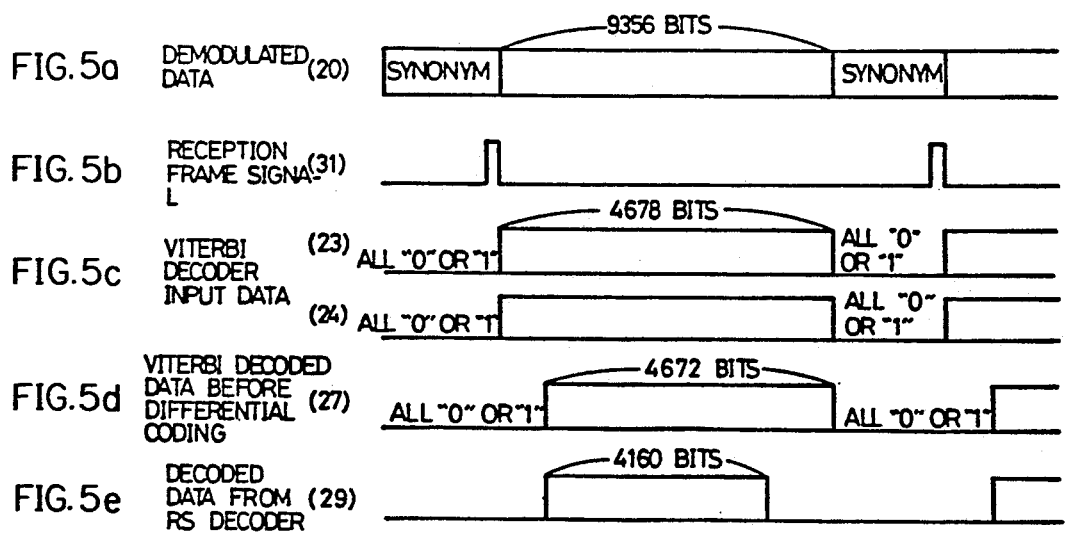

FIG. 11

| $G_k^{(i)}$ | | | | | $\alpha_k^{(i)}$ | | |
|---|---|---|---|---|---|---|---|
| $g_4^{(i)}$ | $g_3^{(i)}$ | $g_2^{(i)}$ | $g_1^{(i)}$ | $g_0^{(i)}$ | $a_2^{(i)}$ | $a_1^{(i)}$ | $a_0^{(i)}$ |
| 0 | 0 | 0 | 0 | 0 | 0 | 0 | 0 |
| 0 | 0 | 0 | 0 | 1 | 0 | 0 | 1 |
| 0 | 0 | 0 | 1 | 0 | 0 | 0 | 1 |
| 0 | 0 | 0 | 1 | 1 | 0 | 1 | 1 |
| 0 | 0 | 1 | 0 | 0 | 0 | 1 | 1 |
| 0 | 0 | 1 | 0 | 1 | 0 | 1 | 1 |
| 0 | 0 | 1 | 1 | 0 | 0 | 1 | 1 |
| 0 | 0 | 1 | 1 | 1 | 1 | 1 | 1 |
| 0 | 1 | 0 | 0 | 0 | 1 | 1 | 1 |
| 0 | 1 | 0 | 0 | 1 | 1 | 1 | 1 |
| ⋮ | | | | | ⋮ | | |
| 1 | 1 | 1 | 1 | 1 | 1 | 1 | 1 |

BASIC BER CHARACTERISTICS REALIZED WITHOUT DIFFERENTIAL CODING

BER CHARACTERISTICS REALIZED
WITHOUT DIFFERENTIAL CODING

SYNONYM NON-DETECTION
PROBABILITY

COMMUNICATION SYSTEM WITH CONCATENATED CODING ERROR CORRECTION

FIELD OF THE INVENTION

This invention relates to communication systems with error correction using concatenated coding scheme and, more particularly, to improvements in a communication system adopting concatenated coding involving the inner code obtained by convolutional coding with Viterbi decoding and the outer code obtained by a Reed-Solomon coding, which realizes powerful error correcting capability in a low CNR (carrier-to-noise power ratio) channel as in space communications.

DESCRIPTION OF THE PRIOR ART

Space communication channels handle weak received electromagnetic waves, so they adopt error correction systems to minimize power required to obtain a pre-determined channel quality.

Among error correction systems, a concatenated coding system, which deals with the inner code obtained by convolutional coding with Viterbi decoding and the outer code obtained using a Reed-Solomon code, has been used for systems having error correcting capability. Now, a prior art communication system using a concatenated coding scheme will be described with reference to the figures.

Communication systems adopting concatenated coding schemes involving convolutional coding with Viterbi decoding and using Reed-Solomon codes are disclosed in K. Y. Liu and J. Lee "Recent results on the use of concatenated Reed-Solomon/Viterbi channel coding and data compensation for space communications," IEEE Trans. Commun , COM-32, pp. 518–523, May 1984 and J. C. Fletcher et al. "Space communication system for compressed data with a concatenated Reed-Solomon-Viterbi coding channel," U.S. Pat. No. 3,988,677, filed in June, 1975. The prior art technique will be described on the basis of this literature.

FIG. 15 is a block diagram showing a prior art concatenated error correction coding communication system adopting convolutional coding with coding rate, $R = \frac{1}{2}$. The system comprises a transmitter 40 and a receiver 41.

In the figure, reference number 1 indicates digital input data which can take a value of either "0" or "1"; 2 indicates a Reed-Solomon (hereinafter referred to as RS) encoder/interleaver; 3 shows RS coded data, 8 shows a convolutional encoder; 9 and 10 show convolutionally encoded data (channels P and Q, respectively), 38 is a quarternary phase-shift keying (hereinafter referred to as QPSK) modulator; 15 is the transmitted signal, 16 is a transmission frame signal for controlling the RS encoder/interleaver; 18 is the received signal; 39 is a QPSK demodulator, 23 and 24 are demodulated data on the channels P and Q (respectively); 25 is an RS decoder/deinterleaver, 29 is the fully decoded data, and 21 is a self-synchronization circuit for the Viterbi decoder 25.

The operation of the transmitter 40 will be described first.

In the transmitter 40, the input data 1 is supplied to the RS coder/interleaver 2 for RS coding followed by interleaving. Parameters of the RS coding are, for example, (1) Symbol size: m = 8 (bits/symbol),
(2) Block length: L = 146 (symbols), and
(3) Information length D = 130 (symbols), the input data 1 with Dm = 1,040 bits is RS coded to produce coded data with Lm = 1,168 bits. The interleaver section of the RS encoder/interleaver 2, interleaves the RS coded symbols forming words according to the interleaving depth of I symbols (e.g., I = 4). Thus, input data 1 with IDm = 4,160 bits is RS coded and interleaved into the RS coded data 3 with ILm = 4,672 bits. The timing of RS coding and interleaving are controlled by the transmission frame signal 16.

The RS coded data 3 is then supplied to the convolutional encoder 8 for convolutional coding. The convolutional encoder 8 uses a convolutional coding system with coding rate $R = \frac{1}{2}$, so that the RS coded data 3 is converted into convolutionally coded data 9 and 10 in two channels, P and Q.

The convolutionally coded data 9 and 10 are supplied to the QPSK modulator 38 for QPSK modulation to produce transmitted signal 15.

The operation of the receiver 41 will now be described. In QPSK modulation, data is transmitted by modulating the phase of the transmission signal with respect to a reference signal (of phase 0 degrees) at the transmitter. The data is obtained at the receiver by demodulating the transmitted signal with respect to a reference signal which is recovered at the receiver (phase 0 degrees). Two bits of information are sent in each time slot, encoded as one of four possible differences in phase: 0 degrees, 90 degrees, 180 degrees, and 270 degrees. Data are mapped to QPSK signals using a Gray code: i.e., 0 degrees corresponds to 00, 90 degrees corresponds to 01, 180 degrees corresponds to 11, and 270 degrees corresponds to 10.

The received signal 18 is supplied to the QPSK demodulator 39, which produces the demodulated data 23 and 24 in two channels, P and Q. The demodulated data 23 and 24 are supplied to the Viterbi decoder 25, which produces the Viterbi decoded data 27, corresponding to the output of convolutional encoder 8.

The Viterbi decoded data 27 is supplied to the RS decoder/deinterleaver 28 for deinterleaving in correspondence with the interleaving in the transmitter, and then RS decoded with the timing thereof controlled by the Viterbi decoded data 27 to obtain decoded data 29.

In this system, if the recovered carrier phase in the QPSK demodulator 39 is skipped from 0 degrees to 90 degrees (e.g., caused by occurrence of a cycle skip of the recovered carrier), the demodulated data 23 and 24 on the two channels P and Q are interchanged. For example, when the receiver's reference phase is skipped by 90 degrees, Q data appears on the P line while logically inverted P data appears on the Q line (This phenomenon is simply designated by an expression that Q$\overline{P}$ is received instead of PQ, where "-" indicates logical inversion, i.e., 01 appears in place of 00, 11 appears in place of 01, 10 appears in place of 11, etc.). Such a phenomenon leads to loss of synchronization in the Viterbi decoder, resulting in a failure of normal operation of the Viterbi decoder 25.

The self-synchronization circuit 21 detects such an out of-sync condition and recovers the synchronization of the Viterbi decoder 25.

The concatenated error correction coding communication system described above can realize powerful error correction and greatly improve the bit error rate (BER) of the received signal. FIG. 16 shows theoretical bit error rate performance. It will be seen in FIG. 16 that the communication system using concatenated coding, of FIG. 15, enables us to greatly reduce the CNR (carrier-to noise power ratio) necessary for obtaining a desired quality of bit error rate. In FIG. 16, it is assumed that the RS coding is the one with the parameters noted above and the convolutional coding is the one with coding rate $R=\frac{1}{2}$ and constraint length $K=7$. The demodulator is assumed to perform a 8-level soft decision to provide 8-level decision data as demodulated data 23 and 24. $E_b$ represents the signal energy per bit of the input data 1, and $N_0$ is the single sided noise power spectral density of white Gaussian noise in the transmission channel.

Thus, this type of concatenated error correction coding communication system has high capability of error correction, and is applicable to earth stations in space communication systems with small sized antennas where the CNR's of their transmission channels are considerably low.

The Viterbi decoder 25 will now be described.

FIG. 17 is a block diagram showing a prior art Viterbi decoder, which is disclosed in A. Shenoy and P. Johnson "Serial implementation of Viterbi decoders," COMSAT Tech. Rev., Vol. 13, No. 2, pp. 315-330 (Fall 1983). In the Figure, reference numeral 101 designates soft decision data; 102, a branch metric calculation circuit; 103, branch metrics; 104, an adder; 105, a comparator; 106, a selector; 107, path metric before normalization; 112, a subtrahend; 113, a subtractor; 114, path metric data after normalization; 115, a register, 116, path metric after normalization; 117, an ACS (add compare-select) circuit; 118, a trellis connection signal; 121, a path memory; 122, Viterbi decoded data; 124, a minimum value detector; and 125, maximum likelihood (ML) state signal.

The operation will now be described. In this Viterbi decoder, the branch metric calculation circuit 102 first calculates branch metrics 103. More specifically, with respect to soft decision data 101 produced from the received signal, the Viterbi decoder calculates branch metrics 103 representing the likelihood of each possible coded data. Without loss of generality, we consider that a branch metric 103 takes on a non-negative value, and its maximum likelihood value is equal to zero.

The ACS circuit 117 performs the path metric calculation, which consists of the following two main functions:

(1) The adder 104, the comparator 105 and the selector 106 in the ACS circuit 117 produce path metrics at time k, denoted as $\{G_k^{(i)};\ i=1, 2, \ldots N\}$ 107 where N is the number of the states of the convolutional code; $N=2^{K-1}$ for a convolutional code with constraint length of K. $G_k^{(i)}$ is calculated by adding the branch metric 103 calculated at time k to normalized path metric data $\{\Gamma_{k-1}^{(i)};\ i=1, 2, \ldots, N\}$ 116 produced at time $k-1$. For each state i, addition of the branch metric data results in data corresponding to more than one path. Comparison and selection is performed so that only data corresponding to the most likely path is retained.

(2) The path metrics are normalized in order to prevent their increase due to noise in the transmission channel. More particularly, at each instant, a subtrahend $\beta_k$ 112 is obtained from the path metrics $\{G_k^{(i)}\}$ 107 before normalization, and each path metric is normalized through subtraction to obtain $\{\Gamma_k^{(i)} = G_k^{(i)} - \beta k;\ i=1,2, \ldots, N\}$. The normalized path metrics 114 thus obtained are stored in the register 115 and are supplied to the adder 104 at the next time instant.

The result of comparison and selection of path metrics information in the ACS circuit 117 is the output signal of the comparator 105 and is referred to as a trellis connection signal. The trellis connection signal is provided to the path memory 121.

In the process of normalization, the minimum value detector 124 detects the minimum value of path metrics $\{G_k^{(i)}\}$ 107 before normalization. At the same time, it detects the state having the minimum path metric (which is referred to as the ML state) and produces ML state signal 125 which is provided to the path memory. For example, with minimum path metric $G_k^{(io)} = \min \{G_k^{(i)}\}$, the subtrahend $\beta k$ 112 is given by $G_k^{(i)}$, and the ML state signal 125 is given by io. The path memory 121 produces the Viterbi decoded data from the trellis connection signal 118 stored in the path memory 121 on the basis of the ML state signal 125.

The RS encoder/interleaver 2 and RS decoder/deinterleaver 28 are disclosed in greater detail in G. C. Clark, Jr., and J. B. Cain "Error-Correction Coding for Digital Communications," Plenum Press, 1981. The Viterbi decoder 25 and self-synchronization circuit 21 are disclosed in detail in Y. Yasuda et al., "Development of variable-rate Viterbi decoder and its performance characteristics," 6th Int. Conf. Digital Satellite Commun., Phoenix, Ariz., pp. XII. 24-XII. 31, Sept., 1983.

Since the prior art concatenated error correction coding system has high error correcting capability, it is employed for a channel with quite low CNR. Therefore, cycle skip of the recovered carrier occurs frequently in the QPSK demodulator 39, leading to frequent loss of synchronization in the Viterbi decoder 25.

Although the concatenated error correction coding system has the self-synchronization circuit 21 for detecting out-of-sync condition and recovering synchronization as noted before, a long time interval is often required to recover the synchronization, which often amounts to several hundreds of bits. Such long time intervals deteriorate the characteristics of the Viterbi decoder and the degraded bit error rate of the decoded data 29 becomes greater than the theoretical value, is described in the above-noted IEEE treatise by Liu and Lee.

Further, the prior art Viterbi decoder presents a problem when its operating speed is increased. More specifically, increasing speed requires enormous hardware for the minimum value detector 124. Maximum operating speed of the Viterbi decoder is, therefore, limited in practice.

To solve this problem, various substitutes for the minimum value detection scheme have been proposed. One example is a scheme in which the subtrahend 112 is set either to a predetermined constant value when all the path metric $\{G^{(i)}k\}$ 107 before normalization are greater than the predetermined value or to zero otherwise. This scheme can be readily realized with simple hardware. Further, an earlier patent application filed by the applicant and entitled "Add-Compare Select Circuit" (see Japanese Patent Disclosure 61-230, 430) proposes a circuit which permits normalization to be obtained effectively with simple hardware by utilizing a special algorithm for producing the subtrahend $\beta_k$ 112.

A problem in the replacement of the minimum value detection scheme with a different scheme resides in that it becomes difficult to produce the ML state having the minimum path metric. Therefore, it is infrequent practice that a high-speed Viterbi decoder does not produce the ML state signal 125 but provides Viterbi decoded data 122 from the path memory 121 on the basis of an arbitrarily fixed state of the code (for example, the first state corresponding to the variable i=1). However, in order to provide decoded data 122 with a satisfactory bit error rate performance without use of the ML state signal 125, it is necessary to increase the amount of trellis connection signal 118 stored in the path memory 121. Thus, if the ML state signal 125 is not produced, the hardware of the path memory 121 is increased, although it is possible to increase the operating speed by simplifying the scheme of state selection.

SUMMARY OF THE INVENTION

An object of the invention is to provide a concatenated error correction compensation communication system, which can realize satisfactory bit error rate performance without causing loss of synchronization even in the situation where cycle skip of the recovered carrier occurs in the demodulator.

Another object of the invention is to provide a Viterbi decoder, which permits effective normalization of path metrics in an ACS circuit with simple hardware and which also functions to permit detection of the ML state with high probability so that it is suited for realizing satisfactory bit error rate performance in high speed operation.

The concatenated error correcting coding communication system includes a differential encoder provided between an RS encoder/interleaver and a convolutional encoder and a differential decoder provided between a Viterbi decoder and a RS decoder/deinterleaver. The 2-channel output of the convolutional encoder is supplied to a parallel-to-serial converter, synchronization words (sync-words) are inserted in gaps of the coded data to produce a continuous bit sequence, and the bit sequence is transmitted after BPSK (binary phase shift keying) modulation. The received signal is BPSK demodulated; the sync-words are detected and removed; the demodulated data produced in this way are supplied after serial-to-parallel conversion to a Viterbi decoder; the RS decoder/deinterleaver completes decoding, operating on the basis of the timing of detection of the sync-words. Even if cycle skip of the recovered carrier occurs in the demodulator, satisfactory bit error rate performance can be realized without loss of synchronization.

The above and other features and advantages of the invention will become more apparent from the following description and the accompanying drawings.

BRIEF DESCRIPTION OF THE DRAWINGS

FIG. 4, comprised of FIGS. 4a–4e, is a time chart showing signal formats in various parts of the transmitter shown in FIG. 1;

FIG. 5, comprised of FIGS. 5a–5e, is a time chart showing signal formats in various parts of the receiver shown in FIG. 3;

FIG. 11 is a truth table showing the operation of the threshold signal generator shown in FIG. 10;

DESCRIPTION OF THE PREFERRED EMBODIMENTS

Figure 1:
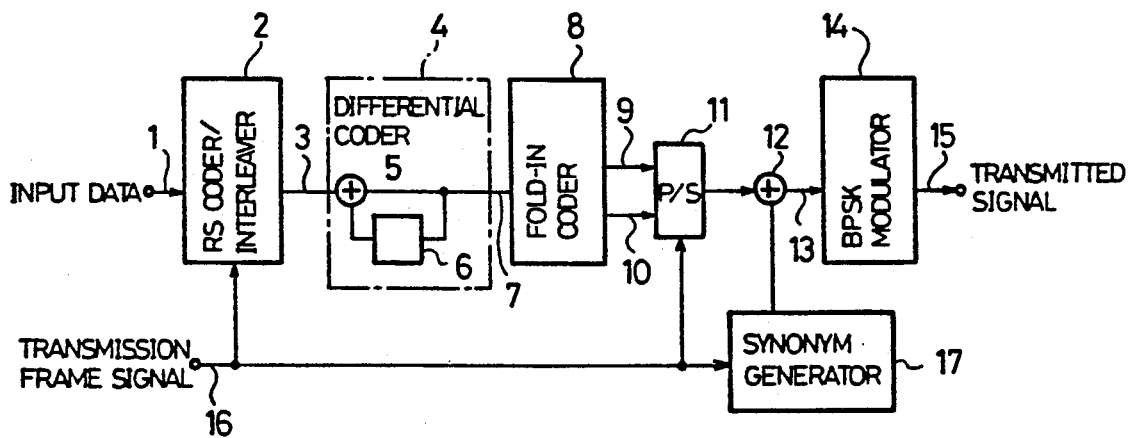
FIG. 1 is a block diagram showing a transmitter of a first embodiment of the concatenated error correction coding communication system according to the invention.

FIG. 1 is a block diagram showing a transmitter of a first embodiment of the concatenated error correction coding communication system according to the invention. Referring to FIG. 1, reference numeral 4 designates a differential encoder, 5 a modulo 2 adder, 6 a one-bit delay element, 7 differentially coded RS coded data, 11 a parallel-to-serial converter, 12 a modulo 2 adder, 13 BPSK modulator input data, 14 a BPSK modulator, and 17 a sync word generator.

Figure 2:
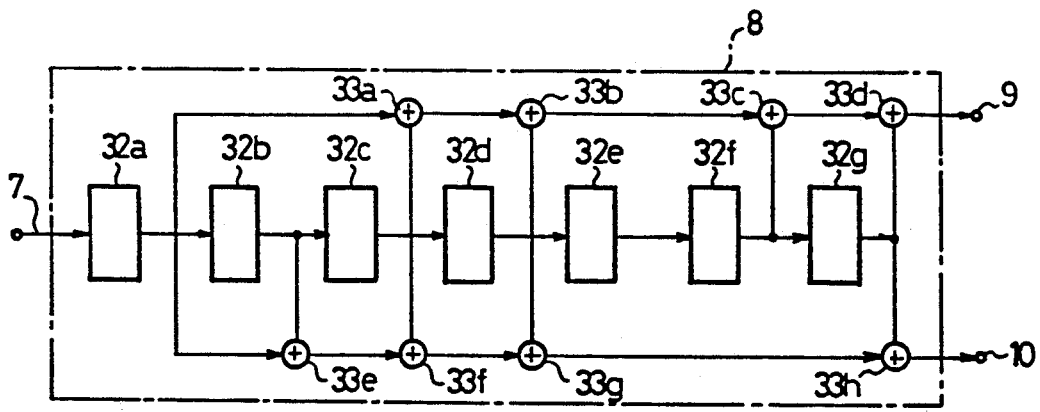
FIG. 2 is a block diagram showing one embodiment of a convolutional encoder contained in the transmitter shown in FIG. 1.

FIG. 2 is a block diagram showing a convolutional encoder 8. Referring to the FIG., 32a to 32g are registers, each of which providing a delay for one-bit; 33a to 33h are modulo 2 adders.

With the above construction of the convolutional encoder 8, if each of the differentially coded, RS coded data 7 input to the encoder 8 is logically inverted, then each of the data output on channels 9 and 10 is also logically inverted. For example, if $\{d_k\} = d_0, d_1, \ldots$ is provided as input 7, assume $\{c_k\} = c_0, c_1 \ldots$ is output on channel 9. If $\{d_k^*\} = d_0^*, d_1^*, \ldots$ is the input 7, then the output on channel 9 is $\{c_k^*\} = c_0^*, c_1^*, \ldots$, where the symbol "*" designates logical inversion.

Figure 3:
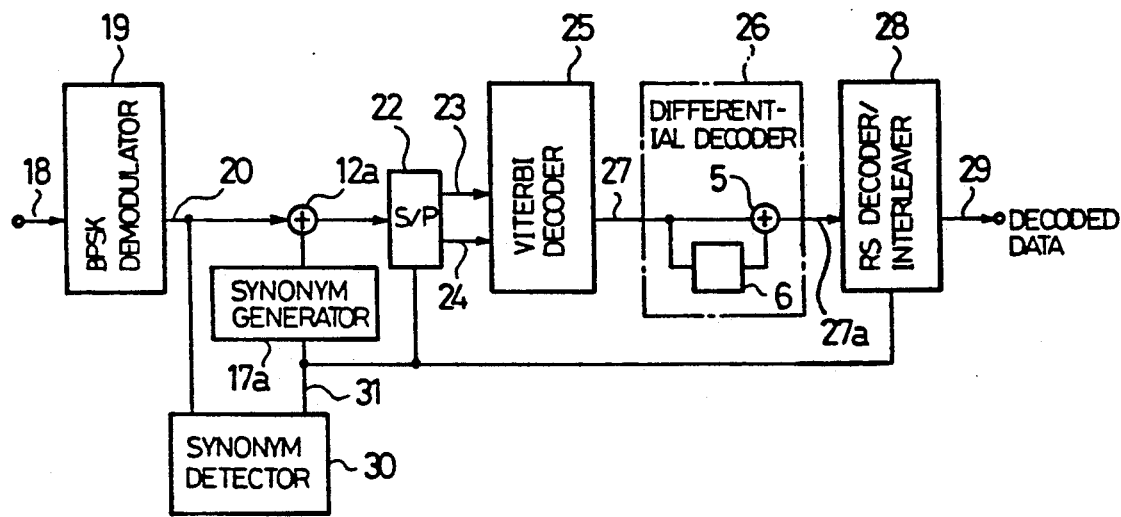
FIG. 3 is a block diagram showing a receiver in the first embodiment.

FIG. 3 is a block diagram showing a receiver of the first embodiment of the system showing in FIG. 1. Referring to the Figure, reference numeral 19 designates a BPSK demodulator, 20 demodulated data, 22 a serial-to-parallel converter, 26 a differential decoder, 30 sync-word detector, and 31 receiving frame signal corresponding to the transmitting frame signal 8.

The operation will now be described.

FIG. 4 is a time chart showing signal formats in various parts of the transmitter shown in FIG. 1. FIG. 5 is a time chart showing signal formats in various parts of the receiver shown in FIG. 2.

First, the operation of the transmitter will be explained with reference to FIGS. 1 and 4.

The input data 1 is supplied to the RS encoder/interleaver 2 for RS coding and subsequent interleaving to obtain RS coded data 3.

The RS coded data 3 is supplied to differential encoder 4 for differential coding shown as $d_i = \mod_2 (r_i + d_{i-1})$, $d_0 = 0$ where $d_i$ is the i-th bit at the output of the differential encoder, and $r_i$ is the i-th bit of the RS coded data.

The differentially coded data 7 provided from the differential encoder 4 is supplied to the convolutional encoder 8, which generates convolutionally coded data 9 and 10 in two channels.

The output of the parallel-to serial converter is supplied to the adder 12, where sync-words having sharp autocorrelation property are inserted in each of the gaps (guard times intervals) of the coded data to obtain modulator input data 13.

The modulator input data 13 is supplied to the BPSK modulator 14 for BPSK modulation to obtain transmitted signal 15.

As in the prior art, the RS encoder/interleaver 2 employs the interleaving depth of I symbols, and effects interleaving in symbols among I RS to produce the RS coded data 3. While the length of I RS codewords is ILm = 4,672 bits (for I = 4), a guard time interval of a suitable length is provided between consecutive groups of RS codewords, each consisting of I RS codewords.

Further, in the differentially coded, RS coded data 7, the guard time interval is filled with a data sequence having either all "0" pattern or all "1" pattern. This is because at the start of the guard time interval the value of the last bit of the RS coded data 7 stored in the delay element 6 determines the value of the succeeding data sequence in the guard time interval after the differential coding.

The convolutional encoder 8 effects convolutional coding continuously on the differentially coded, RS coded data 7 including the data sequence in the guard time interval. Thereafter, the adder 12 inserts a sync-word into portion of the data sequence corresponding to the guard time interval, thus producing the modulator input data 13. The sync-word is inserted through a modulo 2 adder 12. Thus, denoting sync-word pattern by $a_n = (a_1, a_2, \ldots, a_n)$; $a_i$ is a member of the set $\{0,1\}$, $i = 1, \ldots, n$; sync-word data $a_n = (a_1, a_2, \ldots, a_n)$ is supplied to the BPSK modulator 14 if the data sequence in the differentially coded, RS coded data in the guard time interval has all "0" pattern. Data $\{a_n^*\} = (a_1^*, a_2^*, \ldots, a_n^*)$ is supplied if the data sequence in the guard time interval has all "1" pattern.

The demodulator establishes synchronization by detecting the absolute value of the correlation function of the sync-word. Consequently, transmitting the logically inverted sync word $\{a_n^*\}$ is essentially equivalent to transmitting the sync word $\{a_n\}$ in the transmitter.

Now, the operation of the receiver will be described with reference to FIGS. 3 and 5.

The sync-word detector 30 detects sync words in the demodulated data 20 to produce the receiving frame signal 31. The sync-word detector 30 can be readily realized on the basis of a unique word detector which is employed in currently practiced TDMA (time-division multiple-access) space communication systems.

Further, sync-word generator 17a generates sync-words according to the received frame signal 31, which are added to the demodulated data 20 by modulo 2 addition in the adder 12a. In this way, the sync-words are removed from the demodulated data 20, and the data sequence in the guard time interval is changed either to the all "0" pattern or to all "1" pattern.

More specifically, if cycle skip in the recovered carrier does not occur in the BPSK demodulator 19 (i.e., the correct carrier reference phase of 0 degrees is held), the data sequence of the differentially coded RS-coded data including the data sequence in the guard time intervals in the transmitter is reproduced.

If a cycle skip in the recovered carrier occurs in the BPSK demodulator 19, the values of the input data 23 and 24 to the Viterbi decoder are changed. More specifically, when the phase of the recovered carrier skips from 0 degrees to 180 degrees, all the bits of the input data 23 and 24 to the Viterbi decoder inclusive of the data sequence in the guard time interval are logically inverted.

Figure 8:
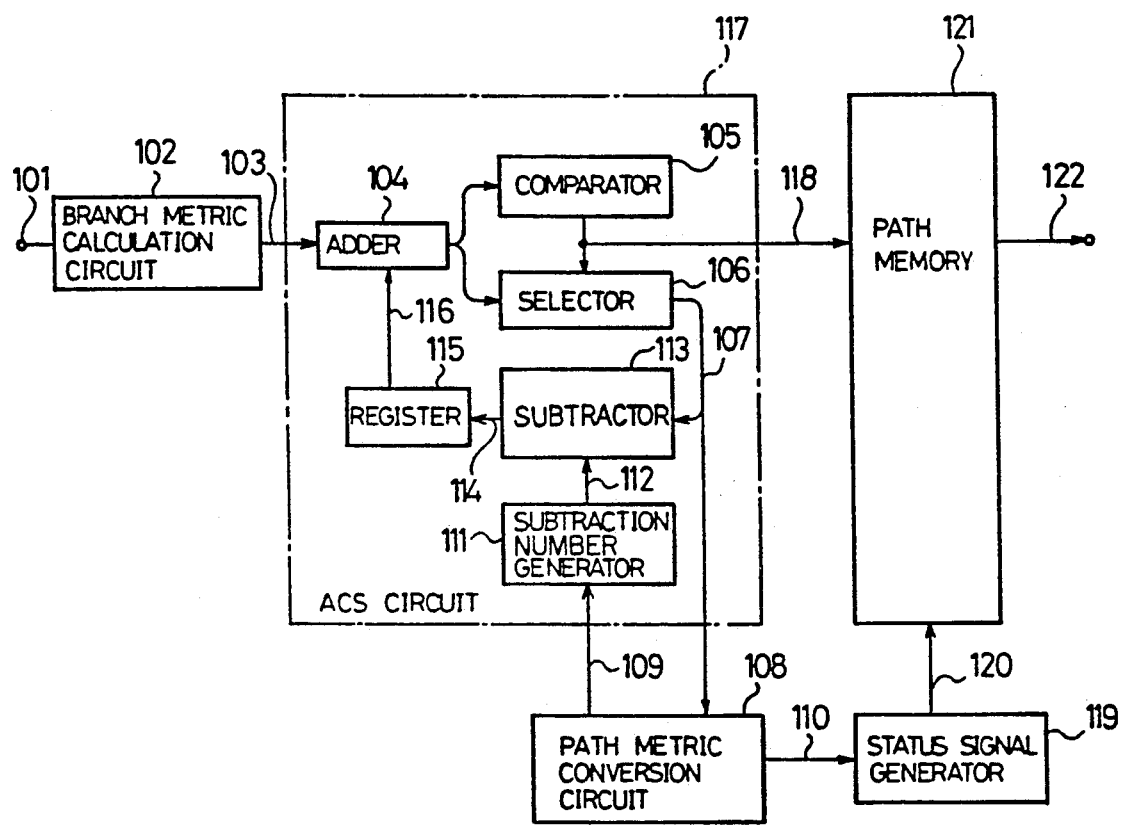
FIG. 8 is a block diagram showing one embodiment of the Viterbi decoder according to the invention.

In the QPSK demodulator 39 employed in the prior art system shown in FIG. 8, the recovered carrier may assume four different phases: 0 degrees, 90 degrees, 180 degrees and 270 degrees. With the BPSK demodulator 18 in the first embodiment shown in FIG. 3, the recovered carrier may assume only two different phases of 0 degrees and 180 degrees.

Figure 15A:
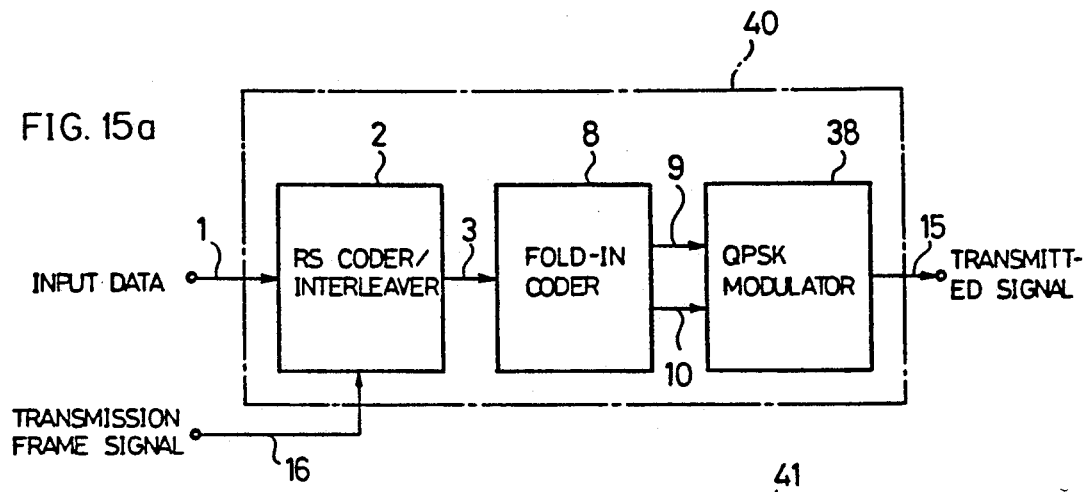
FIG. 15, comprised of FIGS. 15a and 15b, is a block diagram showing a prior art concatenated error correction coding communication system.
Figure 15B:
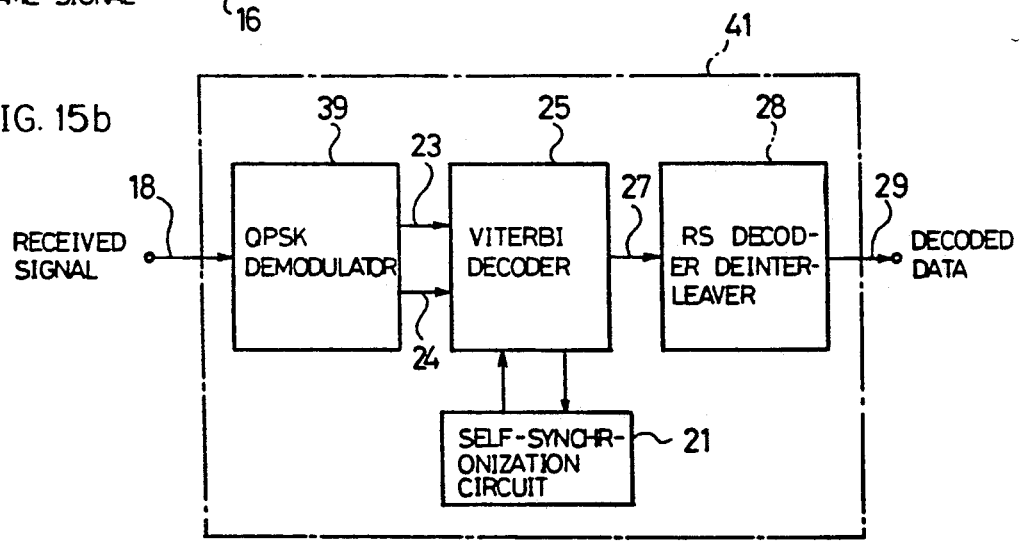

In a QPSK system, two bits of data are sent with each possible phase shift. Data can appear in the wrong channel when cycle skip with 90 degrees of recovered carrier occurs. In the present invention, when the cycle skip of recovered carrier occurs, the data can only be inverted. However, the inverted data is still placed on the proper channel after serial-to parallel conversion. Thus, the present invention, as exemplified in FIG. 3, is free from the phenomenon such that data expected in channel Q appears in channel P with respect to the demodulated data 23 and 24 in the two output channels of serial-to-parallel converter 22, due to a cycle skip of 90 degrees of the recovered carrier. This means that the Viterbi decoder 25 for the convolutional encoder 8 shown in FIG. 2 can operate continuously without losing synchronization with respect to logically inverted data 23 and 24 independent of the occurrence of any reovered carrier cycle skip. Therefore, with the receiver shown in FIG. 3, unlike the prior system showing in FIG. 15, the self-synchronization circuit 21 is unnecessary for continuous operation of the Viterbi decoder 25 inclusive of the guard time intervals.

The output data of the Viterbi decoder 25 is provided to the differential decoder 26 to provide differentially decoded, Viterbi decoded data 27a.

This data 27a is provided to the RS decoder/deinterleaver 28 for decoding to obtain decoded data 29.

At this time, the RS decoder/deinterleaver 28 can operate independently of the recovered carrier phase, because the differentially decoded, Viterbi decoded data 17a has the same value independent of whether the recovered carrier phase is 0 degrees (correct) of 180 degrees (skipped).

As shown above, the first embodiment of the concatenated error correction coding communication system is continuously operable without losing synchronization caused by occurrence of a recovered carrier cycle skip. Further, while the differential coding and decoding are incorporated as means for realizing this, the deterioration of the bit error rate performance due to the incorporation is very slight. This is due to the fact that an error pattern after Viterbi decoding is only bursty, and that the RS decoder has burst error correcting capability.

Figure 6:
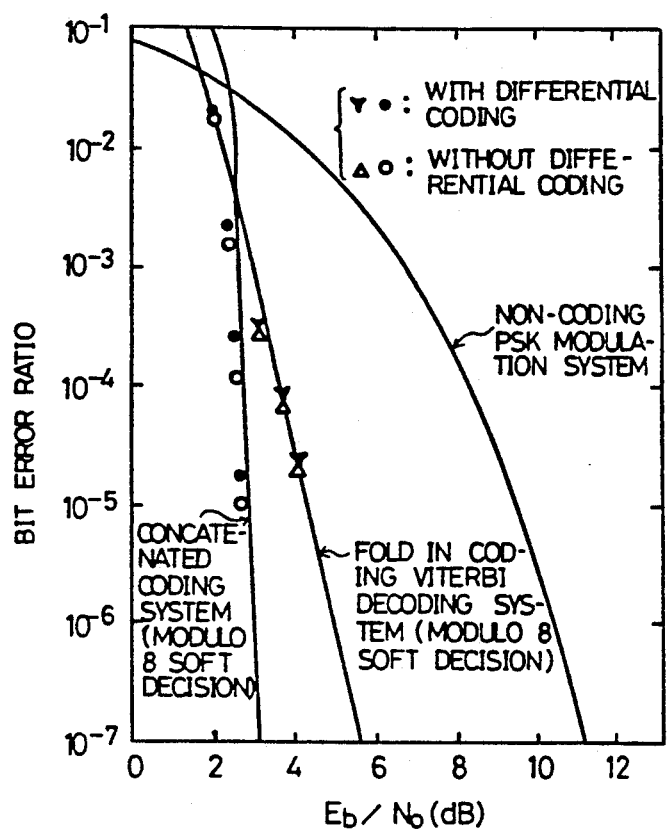
FIG. 6 is a graph showing the results of measurements of the bit error rate performance in one embodiment of the invention.
Figure 16:
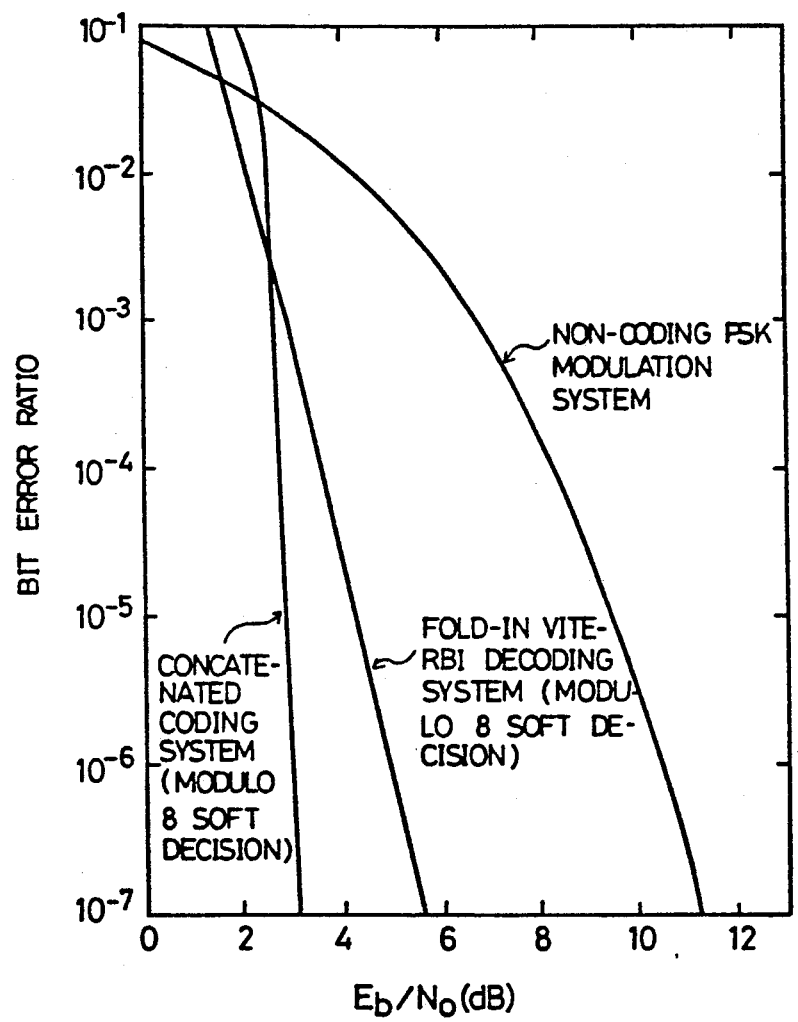
FIG. 16 is a graph showing theoretical bit error rate performance of the concatenated error correction coding communication system.

FIG. 6 shows the results of measurement of bit error rate performance. The parameters of codes shown in FIG. 6 are the same as in the case of FIG. 16. Further, as in the case of FIG. 16, 8-level soft decision is done in the demodulation process.

While the above embodiment has been concerned with convolutional codes with a coding rate of R=½, the same effect may also be obtained for codes having a different coding rate, for instance, a punctured code with R=¾.

A second embodiment of the invention may be applied to burst mode communication.

In burst mode communication, it is necessary to operate the convolutional encoder 8 and Viterbi decoder 25 in burst mode and also to fix the values of the convolutionally coded data 9 and 10 in guard time intervals.

In the first embodiment shown in FIGS. 1 to 5, the convolutionally coded data 9 and 10 in the guard time interval are either all "0" or all "1" and not fixed. In the second embodiment, a differential coding termination circuit 34 is provided between the RS encoder 2 and differential encoder 4 as shown in FIG. 7 so that it is possible to fix all the values in the guard time interval to "0".

Figure 7:
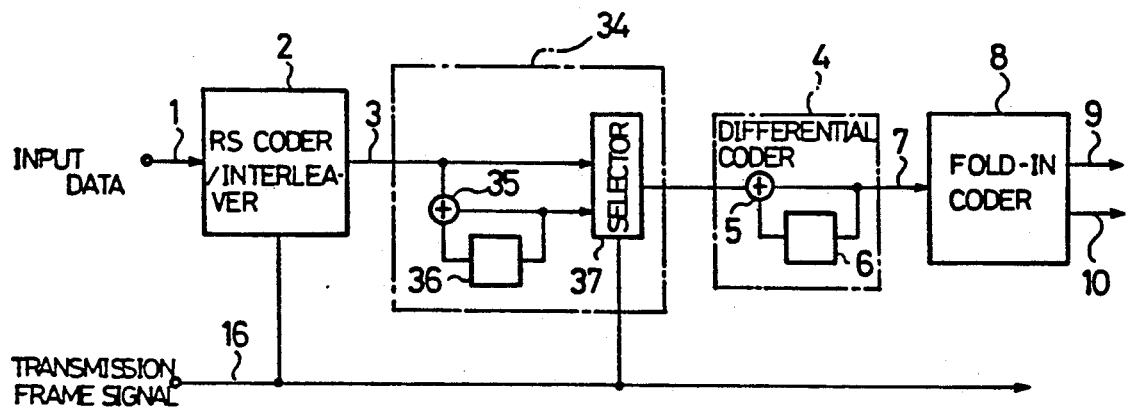
FIG. 7 is a block diagram showing a second embodiment of the invention, with a differential coding termination circuit.

FIG. 7 is a block diagram including a differential coding termination circuit. In the Figure, reference numeral 34 designates the differential coding termination circuit, 35 a modulo 2 adder, 36 a one-bit delay element, and 37 a selector. The adder 35 and the delay element 36 constitute a circuit similar to the differential encoder 4. For this reason, the same data as the RS coded data 7 stored in the delay element 6 in the differential encoder 4 is stored in the delay element 36 except in the guard time interval. The selector forwards the RS coded data 3 to the differential encoder 4, with one exception; the selector 37 selects one bit of data stored in the delay element 36 to the end of the RS coded data 3 at the start of guard time interval. For this reason, at the start of the guard time interval, the same data (either both "0"s or both "1"s) is added in the adder 5 of the differential encoder 4. Thus, the differentially coded, RS coded data 7 in the guard time interval becomes all "0," so that convolutionally coded data 9 and 10, during guard intervals, are fixed to all "0."

Now the Viterbi decoder will be described in detail.

FIG. 8 is a block diagram showing one embodiment of the Viterbi decoder according to the invention. In the Figure, reference numeral 108 designates a path metric conversion circuit; 109, a set of threshold signals $\{\alpha_k{}^i; i=1,2,\ldots,n\}$, each of which is produced from the path metric $G_k{}^i$ in a manner that the path metric in the range of $2^M-1 \leq G_k{}^i < 2^{M+1}-1$ is converted to a threshold signal $\alpha_k^{(i)}=2^M-1$; M=0,1,2, NNN; 110, a discrimination signal $\{\alpha_k{}^i\}$ obtained from particular bits of the threshold signals $\{\alpha_k{}^i\}$; 111, a subtrahend generator; 119, a state signal generator; and 120, a state signal representing the ML state or equivalent thereto.

Figure 9:
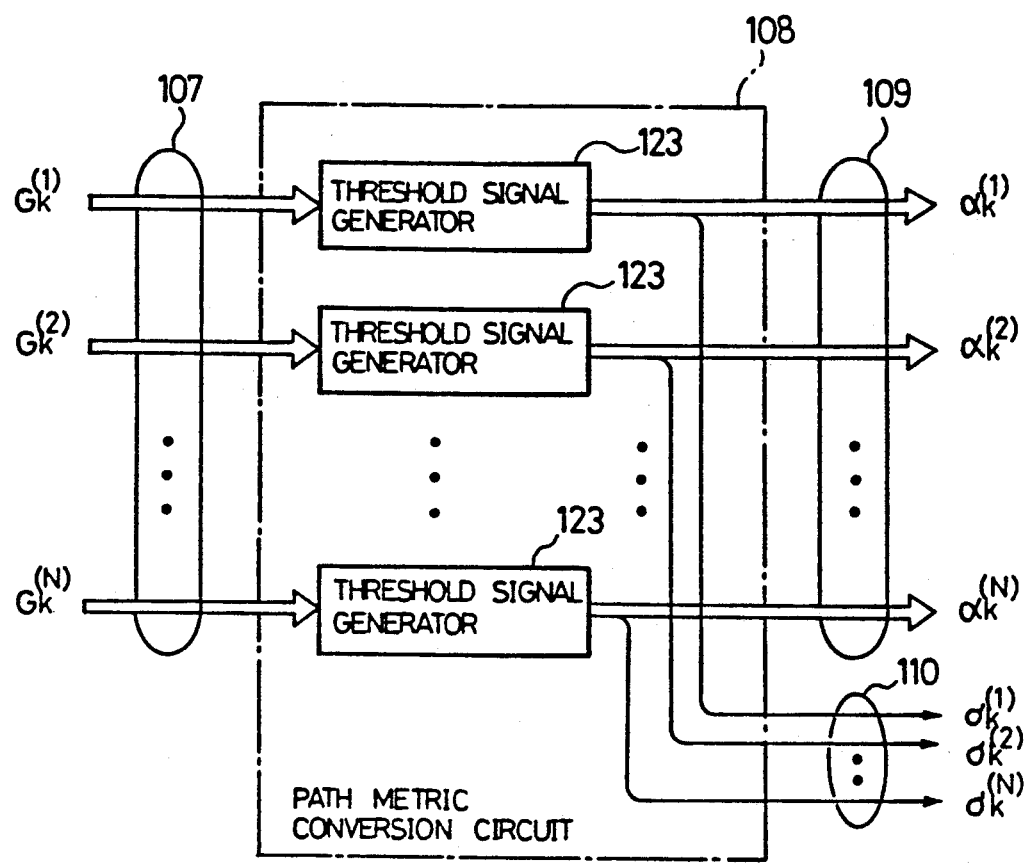
FIG. 9 is a block diagram showing one embodiment of the path metric conversion circuit shown in FIG. 8.
Figure 10:
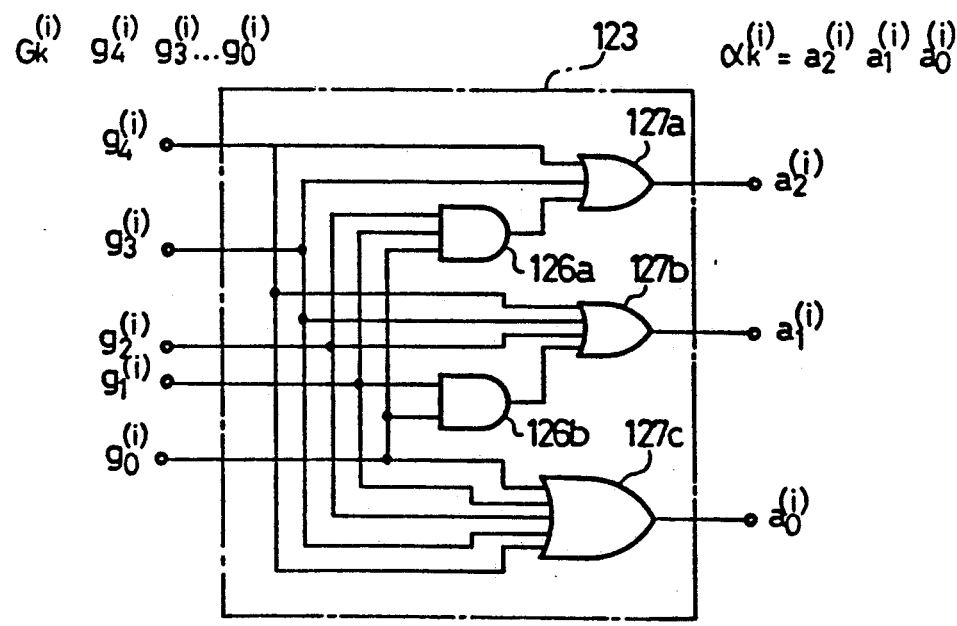
FIG. 10 is one embodiment of the threshold signal generator shown in FIG. 9.

FIG. 9 is a schematic showing an example of the path metric conversion circuit 108. In FIG. 9, reference numeral 123 designates a threshold signal generator. FIG. 10 is a circuit diagram showing an embodiment of the threshold signal generator 23. In FIG. 10, designated as 126a and 126b are AND gates, and 127a to 127c are OR gates. FIG. 11 is a truth table showing the operation of the threshold signal generator showing in FIG. 10.

In the path metric conversion circuit 108 shown in FIG. 9 and threshold signal generator shown in FIG. 10, the portion excluding the function for providing the discrimination signal $\{\sigma_k^{(i)}\}$ may be attained by using a path metric conversion circuit in an embodiment of the aforenoted patent application entitled "Add Compare-Select Circuit."

Figure 17:
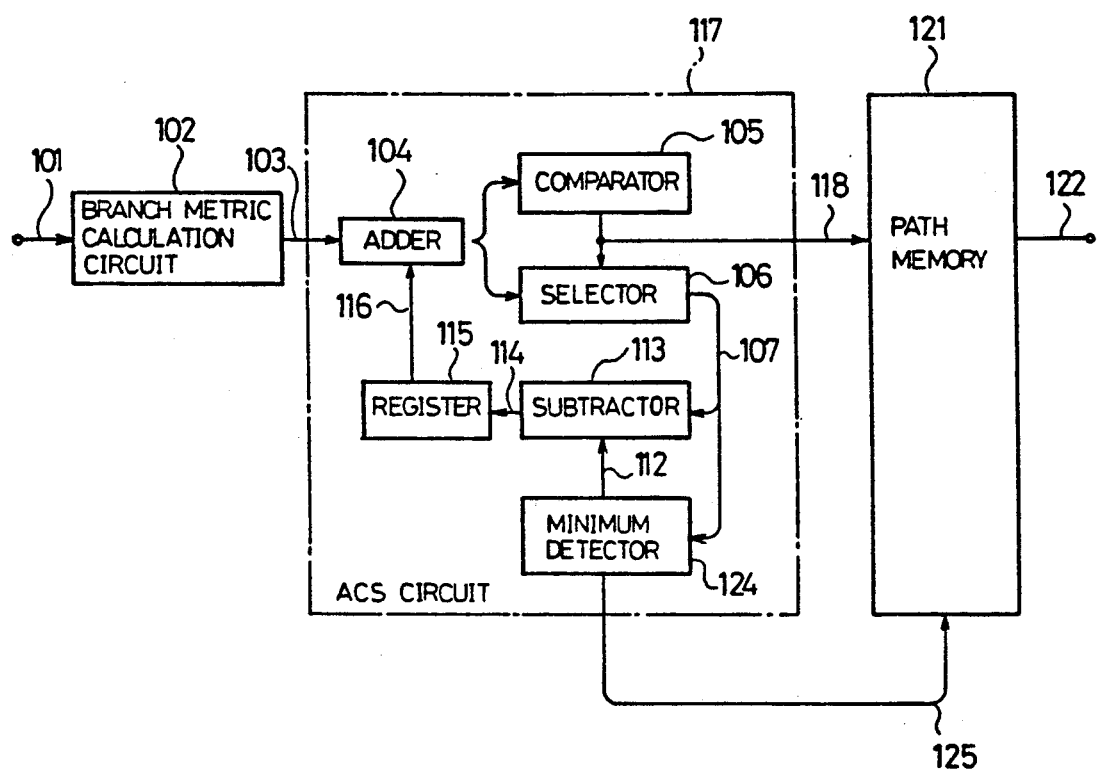
FIG. 17 is a block diagram showing a prior art Viterbi decoder.

Now, the operation will be described. The process of calculating branch metrics 103 from the soft decision data 1 and forming path metrics $\{G_k^{(i)}; i=1, 2, \ldots, N\}$ 107 before normalization is the same as in the prior art Viterbi decoder shown in FIG. 17.

The path metrics $\{G_k^{(i)}\}$ 107 before normalization is provided to a path metric conversion circuit 108 and converted into threshold signals $\{\alpha_k^{(i)}\}$ 109. The subtrahend generator 111 detects the minimum value among the threshold signals $\{\alpha^{(i)}\}$ 109 as the subtrahend $\beta_k$ 112. The threshold signal generator 123 consists of the circuit as shown in FIG. 10, and its operation is expressed as a truth table as shown in FIG. 11. The path metric conversion circuit 108 is discussed in detail in M. Miyake, T. Fujino and K. Fijuwara, "Compression of path metrics in Viterbi decoders," in Proc. GLOBECOM' 87 Tokyo, Japan, pp. 43.2.1–43.2.5, Nov. 1987. Such path metric conversion circuit 108 has the following two main features:

(1) The subtrahend generator 111 having a function to detect the minimum threshold value can be realized with simple hardware. The minimum value can be readily obtained by taking the AND of corresponding bits in the threshold signals $\{\alpha_k^{(i)}\}$ as shown in the literature. This is obvious from the truth table shown in FIG. 11.

(2) Growth in path metrics due to noise can be effectively suppressed to maintain the minimum path metric to a small value. In the ordinary 8-level soft decision Viterbi decoder, the minimum value of the path metric $\{\Gamma_k^{(i)}\}$ 107 after normalization is held in the range of 0 to 3 as is shown in the literature. Because $G_k^{(i)}$ is calculated from $\Gamma_{k-1}^{(i)}$, the minimum value of the path metric among $\{G_k^{(i)}\}$ is also held less than a small value.

Based on the feature (2), the ML state or its equivalent state can be detected using simple hardware, as seen from the following. Since the minimum of the path metrics $G_k^{(i)}$ 107 before normalization takes a small value, the minimum value of the threshold signal $\{\alpha^{(i)}k\}$ becomes zero with high probability. Particularly, where CNR of the received signal is moderately high, the minimum value of the path metric $\{G^{(i)}k\}$ before normalization assumes zero with probability high enough. Thus, by providing the least significant bit of each threshold signal $\alpha_k^{(i)}$ as discrimination signal $\sigma_k{}^{(i)}$ 110, the discrimination signal $\{\sigma_k^{(i)}\}$ represents the state having the minimum path metric $G_k{}^{(i)}=0$. By providing the least significant but one bit of the threshold signal $\alpha_k^{(i)}$ as discrimination signal $\sigma_k^{(i)}$ 110, the discrimination signal $\{\sigma_k^{(i)}\}$ is a signal representing a state having a path metric of $G_k^{(i)} \leq 1$.

In this way, the state with the minimum path metric or its equivalent state can be discriminated with high probability.

According to the discrimination signal $\{\sigma_k^{(i)}\}$ produced in the above way, the state signal generator 119 provides a state signal 120 representing the ML state or its equivalent state.

For example, if the discrimination signal $\sigma_k^{(i)}$ is the least significant bit of the threshold signal $a_k^{(i)}$, the state signal 120 represents the ML state $i_0$, $1 \leq i_0 \leq N$, when the minimum path metric $G_k^{(i_0)} = \min \{G_k^{(i)}\}$, while otherwise it represents an arbitrarily fixed state (for instance, i=1). By setting the relation between the threshold signal $a_k^{(i)}$ and discrimination signal $\sigma_k^{(i)}$ by considering the CNR of the received signal, the state signal 120 can represent the ML state with high probability.

The state signal generator 119 for producing the state signal from the discrimination signal $\{\sigma^{(i)}k\}$ 110 can be readily realized by using the TTL IC "8N74LS148" by Texas Instruments or the FAST TTL IC "74F148" by Signetics.

The above embodiment has been concerned with a path metric conversion circuit with a threshold generator as shown in FIG. 10. However, it is possible to use a path metric conversion circuit shown in the applied patent "Add-Compare-Select circuit" to obtain the same effects as in the above embodiment.

In the coding system in the prior art, (225, 223) Reed-Solomon coding is assumed. In the embodiment of the invention, (146, 130) shortened Reed-Solomon coding is assumed.

Figure 12:
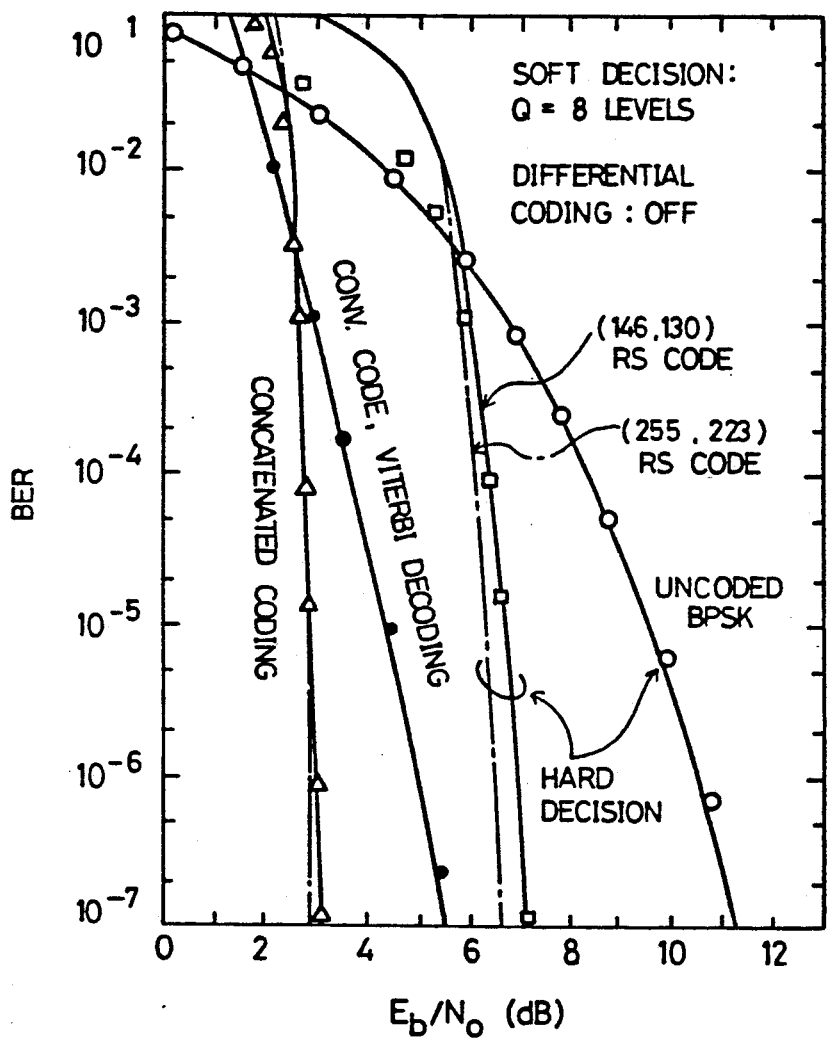
FIG. 12 is a graph showing bit error rate performance for (255, 223) Reed-Solomon code and (146, 130) Reed-Solomon code, when the differential coding is not employed.
Figure 13:
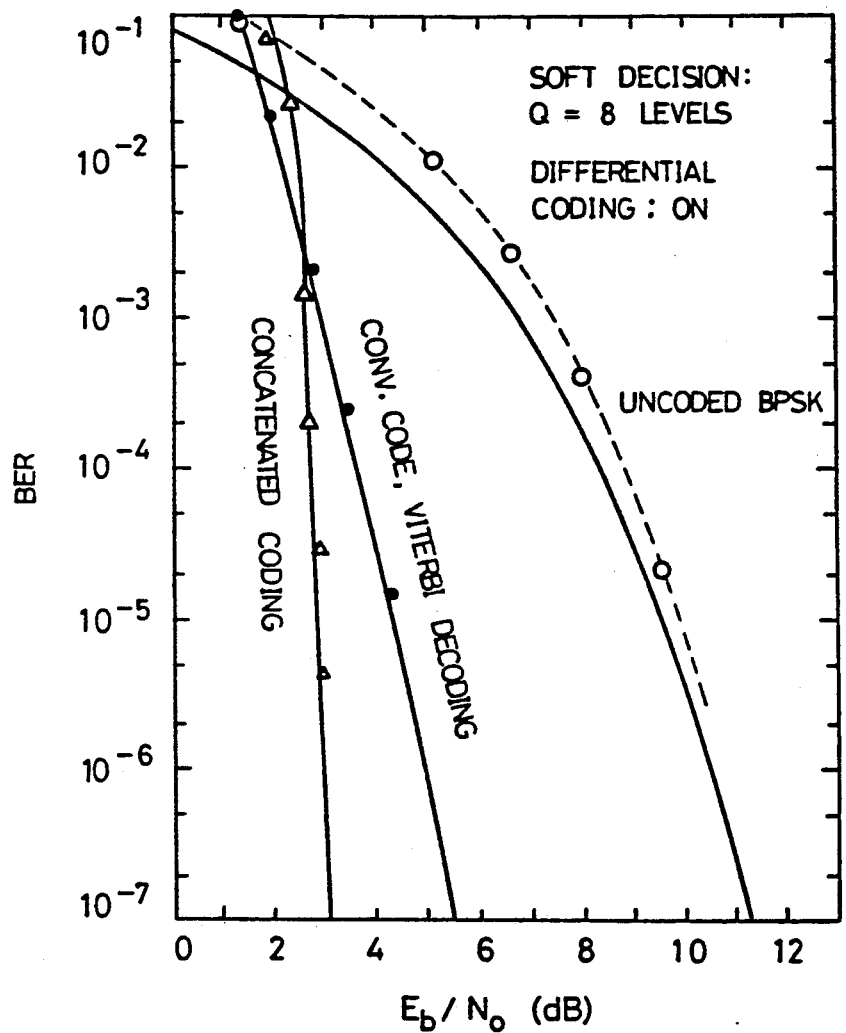
FIG. 13 is a graph showing bit error rate performance for (255, 223) Reed-Solomon code and (146, 130) Reed-Solomon code, when the differential coding is employed.

However, as shown in the bit error rate performance shown in FIGS. 12 and 13, the bit error rate performance realized by the above two kinds of Reed-Solomon coding are substantially the same. Further, this embodiment uses a 225-bit sync word.

Figure 14:
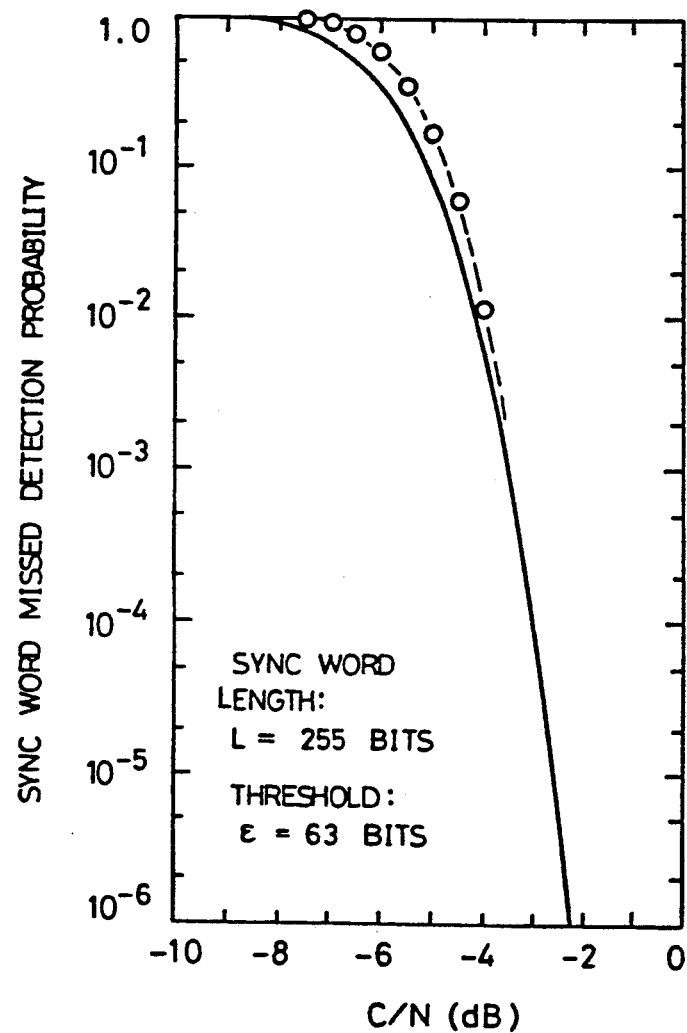
FIG. 14 is a graph showing the missed detection probability of the synchronization word.

FIG. 14 shows the results of measurement of the sync word missed detection probability on the receiving side. As is seen from FIG. 14, the concatenated error correction coding system can realize BER of $10^{-6}$ at $Eb/N_0 \approx 3.0$ dB. Meanwhile, at this operating point, the sync word missed detection probability is sufficiently small, so that stable synchronization performance can be obtained.

Further, according to the invention, the Viterbi decoder includes, instead of a complex minimum value detection circuit for detecting the minimum path metric, there is a circuit for converting the path metric using pre-determined rules, a circuit for generating a subtrahend for normalization from the output of the path metric conversion circuit using simple hardware, and a circuit for detecting the ML state or its equivalent state from the output signal of the path metric conversion circuit with high probability. It is thus possible to reduce the hardware of the ACS circuit in the Viterbi decoder and produce decoded data having satisfactory bit error rate performance without increasing hardware of the path memory. It is thus possible to realize a Viterbi decoder suited for high speed operation.

What is claimed is:

1. A concatenated error correction coding communication system for transmitting and receiving data through conversion of data into concatenated coding data consisting of outer and inner codes comprising a transmitting section and a receiving section;

said transmitting section including
   Reed-Solomon coding means for outer coding of data;
   interleaver means for interleaving said outer coded data and providing coded data;
   differential coding means for differentially coding the coded data provided from said interleaver means to provide differentially coded data;
   convolutional coding means for convolutionally coding said differentially coded data nd providing 2-channel convolutionary coded data, said convolutional coding means providing logically inverted convolutionally coded data when receiving logically inverted data;
   means for parallel-to-serial converting 2-channel convolutionally coding data from said convolutional coding means into a convolutionally coded data sequence;
   means for inserting sync-words in gaps of said convolutionally coded data sequence; and
   binary phase shift keying modulation means for transmitting data sequence with said sync-word after binary phase shift keying modulation; and said receiving section including
   demodulating means for demodulating the received signal by binary phase shift keying modulation to provide demodulated data;
   means for detecting and removing sync-words in said demodulated data;
   means for serial-to-parallel converting the demodulated data without sync-words to produce 2-channel demodulated data sequence;
   means for Viterbi decoding the 2-channel demodulated data sequence to obtain Viterbi decoded data;
   differentially decoding means for differentially decoding Viterbi decoded data to provide differentially decoded data; and
   means for Reed-Solomon decoding and deinterleaving said differentially decoded data in synchronization with reception of the sync-word, responsive to said means for detecting to provide decoded data.

2. The concatenated error correction coding communication system according to claim 1, wherein said demodulating means includes means for synchronization of the transmitter section's and the receiver section's reference signals, comprising:
   means for obtaining an absolute value of the correlation function of said sync-word with a reference sync-word; and
   means responsive to said absolute value for synchronizing the timing of said transmitting section and said receiving section.

3. The concatenated error correction coding communication system described in claim 1, wherein said differential coding means includes a register for performing delay for one bit and an adder for performing modulo 2 addition, the output data of said adder being fed back through said register to the adder for addition to the input data in said adder to obtain differential coding.

4. A concatenated error correction coding communication system according to claim 1, wherein said Viterbi decoder includes:
   a memory means for storing normalized path metric information;
   a path memory means for storing trellis connection signals which constitute candidates for Viterbi decoded data;
   path metric conversion means for converting path metric information before normalization into a plurality of threshold signals each having consecutive zeros in the part of more significant bits and corrective ones in the part of less significant bits in its binary number representation by using a predetermined rule;

subtrahend generation means for obtaining the minimum value of said threshold signals said means including plurality of AND gates each having its inputs connected to each corresponding bits of the said threshold signals, and means for using said minimum value as a subtrahend for normalization of said path metric information; and state signal generation means for determining a state with a path metric having the minimum value of said threshold signal according to a discrimination signal obtained by a set of signals each represents the predetermined bit of each of said threshold signals and for supplying said state to said path memory.

5. A concatenated error correction communication system according to claim 4, wherein each of said threshold signals is represented by a binary number with its more significant bits being mostly zeros and its less significant bits being mostly ones.

6. A data communication system with error correction, for transmitting and receiving data comprising:
a. a transmitter including,
    a convolutional encoder for convolutionally coding data to be transmitted,
    sync-word insertion means for receiving said convolutionally coded data and for providing a continuous data stream from said convolutionally coded data by inserting sync-words into gaps in the convolutionally coded data thereby producing a data stream with no gaps, and
    means for transmitting said continuous data stream over a medium; and
b. a receiver including,
    receiving means for receiving said data stream from said medium and for providing a received data stream,
    sync-word deletion means for providing a reproduced convolutionally coded data stream by receiving said received data stream and removing the sync-words from said received datastream, and
    a Viterbi decoder for receiving the reproduced convolutionally coded data stream and for providing Viterbi decoded data from said reproduced convolutionally coded data.

7. The system described in claim 6 wherein said Viterbi decoder comprises:
a. a memory means for storing path metric information, said path metric information including a plurality of digital path metric words each word representing the likelihood that assumed data sequence as candidates for Viterbi decoded data along each path is correct;
b. means for calculating path metric information from path metric information stored in said memory and from branch metrics produced by the received symbol;
c. means for generating a plurality of threshold signals from the path metric information, each threshold signal defining a digital word having fewer bits than each path metric word, having consecutive zeros in the part of more significant bits and consecutive ones in the part of less significant bits in its binary-number representation;
d. means responsive to said threshold signals for determining the maximum likelihood (ML) state where said ML state has a minimum path metric value; and
e. means for normalizing path metric words by subtracting a threshold signal with minimum value from each of the path metric words.

8. The system described in claim 6 wherein said sync-word insertion means includes means for generating sync-words and wherein said sync-word deletion means includes,
    means for detecting sync-words
    means for generating receiver-generated sync-words, and
    means responsive to the means for detecting sync-words for deleting said sync-words by adding the receiver-generated sync-words to sync-words in the received data stream.

9. The system described in claim 8 wherein said means for detecting sync-words detects sync-words by obtaining correlation between bits in the received data stream and bits in a receiver-generated sync-word.

10. The system described in claim 8, wherein said transmitter further includes a differential encoder for differentially coding input data and for providing the differentially coded data to the convolutional encoder as the data to be transmitted, and wherein said receiver includes a differential decoder for differentially decoding the Viterbi decoded data.

11. The system described in claim 10 wherein said Viterbi decoder comprises:
a. a memory means for storing path metric information, said path metric information including a plurality of digital path metric words each word representing the likelihood that assumed data sequence as candidates for Viterbi decoded data along each path is correct;
b. means for calculating path metric information from path metric information stored in said memory and from branch metrics produced by the received symbol;
c. means for generating a plurality of threshold signals from the path metric information, each threshold signal defining a digital word having fewer bits than each path metric word having consecutive zeros in the part of more significant bits and consecutive ones in the part of less significant bits in its binary-number representation;
d. means responsive to said threshold signals for determining the maximum likelihood (ML) state where said ML state has a minimum path metric value; and
e. means for normalizing path metric words by subtracting a threshold signal with minimum value from each of the path metric words.

12. The system described in claim 10 wherein said transmitter further includes a Reed-Solomon encoder/interleaver for Reed-Solomon coding and interleaving input data and for providing RS-coded data as input to said differential encoder, and wherein said receiver further includes a Reed-Solomon decoder/deinterleaver for RS-decoding the decoded data provided by the differential decoder.

13. The system described in claim 12 wherein said Viterbi decoder comprises:
a. a memory means for storing path metric information, said path metric information including a plurality of digital path metric words each word representing the likelihood that assumed data sequence as candidates for Viterbi decoded data along each path is correct;
  b. means for calculating path metric information from path metric information stored in said memory and from branch metrics produced by the received symbol;
  c. means for generating a plurality of threshold signals from the path metric information, each threshold signal defining a digital word having fewer bits than each path metric word, having consecutive zeros in the part of more significant bits and consecutive ones in the part of less significant bits in its binary-number representation;
  d. means responsive to said threshold signals for determining the ML state where said ML state has a minimum path metric value; and
  e. means for normalizing path metric words by subtracting a threshold signal with minimum value from each of the path metric words.

14. The system described in claim 12, wherein said transmitter further includes differential coding termination means for fixing to zero the output of the differential encoder in all guard time intervals.

15. The system described in claim 14, wherein said differential coding termination means includes
  a register for delaying a signal for one bit interval;
  an adder for performing modulo-2 addition;
  a selector; and
  said register and adder constituting a circuit similar to said differential coding means, and said selector adding one bit of data stored in said register to the last bit of said Reed-Solomon coded data at the start of each said guard time interval.

16. A Viterbi decoder for decoding received symbols, comprising:
  a. a memory means for storing path metric information, said path metric information including a plurality of digital path metric words each word representing the likelihood that assumed data sequence which is a candidate for Viterbi decoded data along each path is correct;
  b. means for calculating path metric information from path metric information stored in said memory and from branch metrics generated from the received symbol;
  c. means for generating a plurality of threshold signals from the path metric information, each threshold signal defining a digital word having fewer bits than each path metric word having consecutive zeros in a part comprising more significant bits and consecutive ones in a part comprising less significant bits in its binary-number representation;
  d. means responsive to said threshold signals for determining the ML state where said ML state has a minimum path metric value; and
  e. means for normalizing path metric words by subtracting a threshold signal with minimum value from each of the path metric words.

17. The decoder described in claim 16 wherein said means for determining the ML state includes
  means for generating a plurality of discrimination signals, each discrimination signal provided in correspondence with a threshold signal, and
  means responsive to the discrimination signals for generating the ML state signal by determining the discrimination signal of least magnitude.

18. The decoder described in claim 17 wherein each of said discrimination signals comprises a predetermined number of bits of said corresponding threshold signal.

19. The decoder described in claim 18 wherein the predetermined of bits is set to a number of bits which is as small as possible while quaranteeing a high likelihood that a minimum path metric word can be determined, given the anticipated frequency of errors in the transmission medium.

20. The decoder described in claim 19 wherein the predetermined number of bits is a set of least significant bits of each of said threshold signals.

21. A transmitter for a concatenated error correction coding communication system, comprising:
  Reed-Solomon coding means for outer coding of data to be transmitted;
  interleaver means for interleaving said outer coded data and providing coded data;
  differential coding means for differentially coding the coded data provided from said interleaver means to provide differentially coded data;
  convolutional coding means for convolutionally coding said differentially coded data and providing 2-channel convolutionary coded data, said convolutional coding means providing logically inverted convolutionally coded data when receiving logically inverted data;
  means for parallel-to-serial covering 2-channel convolutionally coding data from said convolutional coding means into a convolutionally coded data sequence;
  means for inserting sync-words in gaps of said convolutionally coded data sequence; and
  binary phase shift keying modulation means for transmitting data sequence with said sync-word after binary phase shift keying modulation.

22. A receiver for a concatenated error correction coding communication system, comprising:
  demodulating means for demodulating a received signal by binary phase shift keying modulation to provide demodulated data;
  means for detecting and removing sync-words in said demodulated data;
  means for serial-to-parallel converting the demodulated data without sync-words to produce 2-channel demodulated data sequence;
  means for Viterbi decoding the 2-channel demodulated data series to obtain Viterbi decoded data;
  differentially decoding means for differentially decoding Viterbi decoded data to provide differentially decoded data; and
  means for Reed-Solomon decoding and deinterleaving said differentially decoded data in synchronization with reception of the sync-word, responsive to said means for detecting to provide decoded data.

* * * * *